(12) United States Patent
Wang et al.

(10) Patent No.: US 11,658,198 B2
(45) Date of Patent: *May 23, 2023

(54) IMAGE SENSOR WITH THROUGH SILICON FIN TRANSFER GATE

(71) Applicant: OMNIVISION TECHNOLOGIES, INC., Santa Clara, CA (US)

(72) Inventors: Qin Wang, San Jose, CA (US); Gang Chen, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 211 days.

This patent is subject to a terminal disclaimer.

(21) Appl. No.: 16/998,783

(22) Filed: Aug. 20, 2020

(65) Prior Publication Data
US 2022/0059599 A1    Feb. 24, 2022

(51) Int. Cl.
*H01L 27/146* (2006.01)

(52) U.S. Cl.
CPC .. *H01L 27/14643* (2013.01); *H01L 27/14603* (2013.01); *H01L 27/14609* (2013.01)

(58) Field of Classification Search
CPC ......... H01L 27/14616; H01L 27/14612; H01L 27/14603
See application file for complete search history.

(56) References Cited

U.S. PATENT DOCUMENTS

| | | | |
|---|---|---|---|
| 7,749,831 B2 * | 7/2010 | Lyu | H01L 27/14603 257/E21.189 |
| 9,443,900 B2 | 9/2016 | Yamashita | |
| 10,566,361 B2 * | 2/2020 | Wei | H01L 27/14643 |
| 2014/0252420 A1 | 9/2014 | Yi et al. | |

* cited by examiner

*Primary Examiner* — David A Zarneke
(74) *Attorney, Agent, or Firm* — Christensen O'Connor Johnson Kindness PLLC

(57) ABSTRACT

A device includes a photodiode, a floating diffusion region, a transfer gate, and a channel region. The photodiode is disposed in a semiconductor material. The photodiode is coupled to generate charge in response to incident light. The floating diffusion region is disposed in the semiconductor material. The transfer gate is disposed between the photodiode and the floating diffusion region. The channel region associated with the transfer gate is in the semiconductor material proximate to the transfer gate. The transfer gate is coupled to transfer the charge from the photodiode to the floating diffusion region through the channel region in response to a transfer signal coupled to be received by the transfer gate. The transfer gate includes a plurality of fin structures that extend into the semiconductor material and the photodiode.

21 Claims, 6 Drawing Sheets

IMAGE SENSOR WITH THROUGH SILICON FIN TRANSFER GATE

BACKGROUND INFORMATION

Field of the Disclosure

This disclosure relates generally to image sensors, in particular to image sensors with pixels including transfer gates.

Background

Image sensors may be used in various devices including cameras, sensors, and consumer electronics. A typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene. Image sensors may include pixels with transfer gates controlling when a photogenerated charge in a photodiode is transmitted to floating diffusion region.

With the ever-decreasing sizes of image sensors and the individual imaging pixels that are part of a sensing array, it is important to more efficiently capture incident light that illuminates the sensing array. Thus, more efficiently capturing incident light helps to maintain or improve the quality of electronic images captured by the sensing arrays of ever-decreasing sizes. The quality of an electronic image can be improved, for example, by reducing image lag. Image lag can be caused by charge(s) in a photodiode region of a pixel that has not been removed from exposure to a previous image captured degrading image quality. Accordingly, there is a need to reduce the image lag in photodiodes to improve the image quality of sensing arrays.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
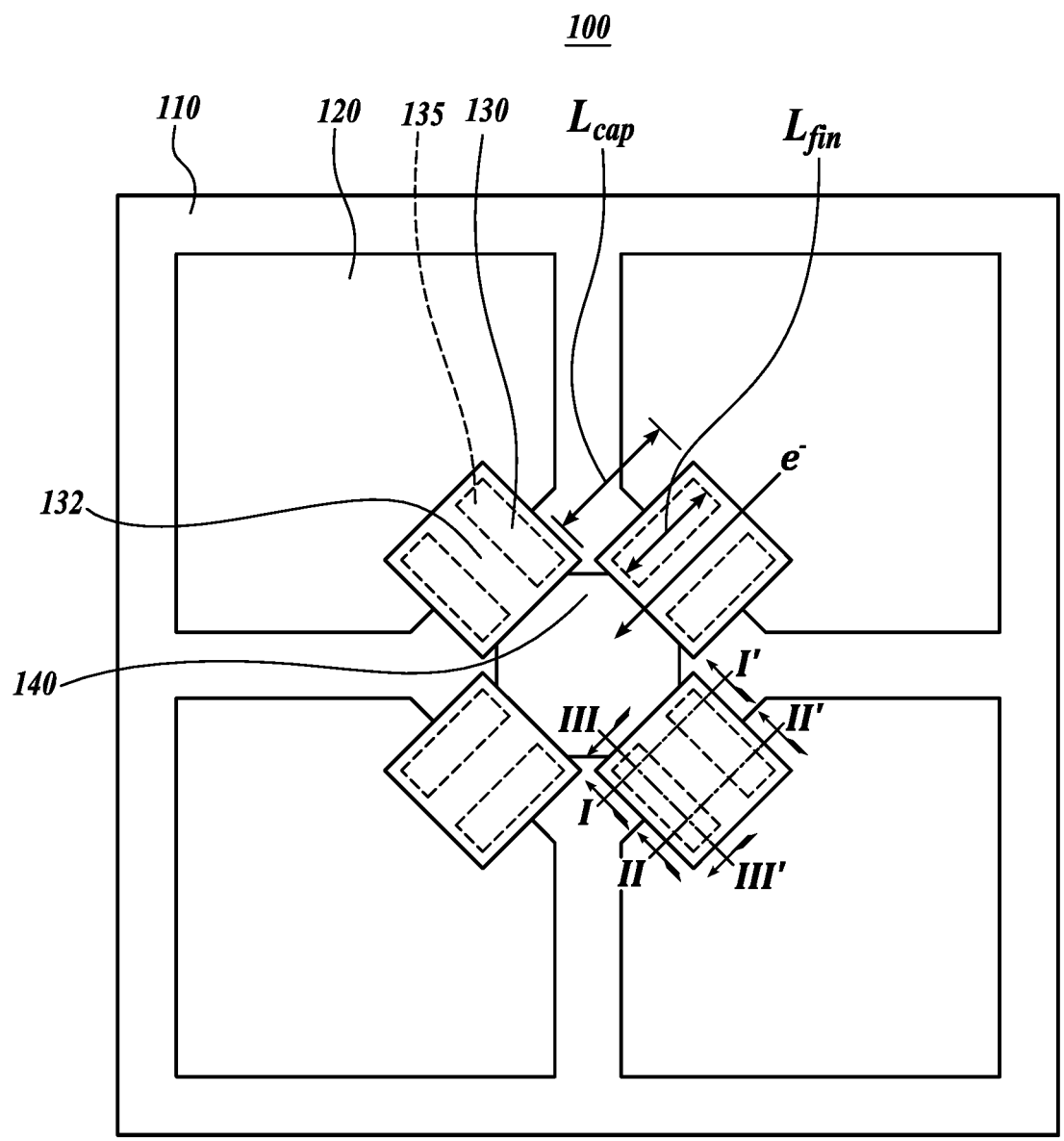
FIG. 1 illustrates a top view of an example device in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to image sensors and devices, and methods for fabricating image sensors are disclosed herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

The term semiconductor substrate may refer to substrates formed using semiconductors such as silicon, silicon-germanium, germanium, gallium arsenide, and combinations thereof. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Image sensors may include many individual pixels formed in semiconductor material, each pixel may include a photodiode. Each photodiode generates one or more charges when incident light enters the photodiode during an integration period or an exposure time. The charge is transferred through a channel region to a drain. The drain may be a floating drain (commonly referred to as floating diffusion region). The channel region allows the photogenerated charge(s) to transfer to the floating diffusion region based on a voltage applied to a transfer gate. The voltage of the transfer gate is controlled by a controller. The shape and location of the transfer gate as well as the doping profile of the photodiode affect the speed and resistance with which the channel region can pass the charge from the photodiode to the floating diffusion region. The charge being transferred to the floating diffusion region is readout by the controller.

As will be discussed, example image sensors and pixels disclosed herein have an architecture that improves performance of the pixels with regards to speed and accuracy of reading out the charges generated by the photodiodes. In one example, the transfer gate includes fin-like structures formed along a channel width direction of the transfer gate, which increases an effective channel width of a channel region associated with the transfer gate formed between the photodiode and the drain (floating diffusion region). This provides high transfer current, allowing high speed travel of charges directly from the photodiode to the floating diffusion region, thereby reducing the image lag issue and also enabling better leakage control.

FIG. 1 illustrates a top view of an example device 100 in accordance with the teachings of the present invention. In an embodiment, device 100 may be an image sensor, for example a CMOS image sensor device. In embodiments, device 100 may be part of image sensor, for example a pixel cell. The device 100 may be formed in a semiconductor material or semiconductor substrate (such as silicon substrate) and may include an isolation layer 110, one or more photodiodes 120, transfer gates 130, and floating diffusion region 140. FIG. 1 illustrates a four-shared pixel layout, in which four photodiodes 120 in a pixel cell are coupled to a floating diffusion region 140 through respective transfer gates 130, and each transfer photogenerated charges from the respective photodiodes 120 to the floating diffusion region 140 through the respective transfer gate 130, for example in the direction of the arrow marked e⁻.

The isolation layer 110 may surround each of the photodiodes 120 and electrically isolate each photodiodes 120 from adjacent photodiodes and other components (e.g., pixel transistor) of the device 100. The isolation layer 110 may be formed from an implant isolation well having a conductive type opposite to the conductive type of photodiodes, and same conductive type as semiconductor material. In embodiments, the portion of the isolation layer 110 surrounding the photodiodes 120 may be formed by deep trench isolation or P-type doped implantation. The isolation layer 110, as described in further detail below, may be formed above and below the photodiodes 120.

The photodiodes 120 include a photodiode region formed of an N-type doped region in the semiconductor material (e.g., a P-type doped semiconductor material). The photodiodes 120 may be formed by ion implantation of N-type dopants e.g., phosphorus, arsenic. The photodiodes 120 having a conductive type opposite the conductive type of semiconductor material. The photodiodes 120 may be arranged in the semiconductor material in such a way that incident light causes the photodiodes 120 to photogenerate and accumulate one or more charges, for example by light absorption in the photodiode region of the photodiode. In some embodiments, the photodiode region of the photodiode 120 may have a gradient doping concentration profile across the implant depth of the photodiode region of the photodiode. In some embodiments, each of photodiode 120 is in a form of a pinned photodiode. For example, each of photodiode 120 is a p-n-p pinned photodiode, constructed using a P-type semiconductor material, an N-type doped region implanted into the P-type semiconductor material, and a pinning layer (e.g., heavily P-type doped) implanted into semiconductor material between a surface of semiconductor material and the N-type doped region. This pinning layer acts as the "pin" in a p-n-p photodiode.

Each of the transfer gates 130 may include a planar gate disposed on a semiconductor material surface (e.g., front surface) and vertical gates or fin gates (fin structures) disposed in the semiconductor material. Each of the transfer gates 130 may be formed of conductive material such as polysilicon material, metal material, or other material suitable for forming a gate electrode. In the illustrated embodiment, each of the transfer gates 130 include a cap portion 132 (planar gate) and fin structures 135 (vertical gates). In the example embodiment shown in FIG. 1, each of the transfer gates 130 includes cap portion 132 and two fin structures 135. The cap portion 132 is formed on a surface (e.g., front surface) of the semiconductor material. Each of fin structures 135 is extended from the cap portion 132 a depth into the semiconductor material. In embodiments, the depth of each fin structures is less than a thickness (e.g., 2 μm~6 μm) of the semiconductor material. For example, the depth that each fin structures extended into the semiconductor material may range between 0.2 μm-0.5 μm. The cap portion 132 is electrically connected to the fin structures 135 of transfer gate 130, and the fin structures 135 are electrically connected in parallel. The fin structures 135 of the transfer gate 130 further laterally extends (in a length direction) from a respective photodiode 120 to the floating diffusion region 140, i.e., extend along a channel direction of respective transfer gate 130. In embodiments, the length $L_{fin}$ of each fin structure 135 is less than the length $L_c$ of cap portion 132. However, the transfer gates 130 may include any number of fin structures 135 extended from the cap portion 132 and connected in parallel.

It is appropriated by those skilled in the art that the channel length direction of transfer gate 130 refers to a direction where photogenerated charges flows e.g., along direction from photodiode 120 to floating diffusion region 140 (direction of e⁻), the channel width direction of transfer gate 130 refers to a direction lateral across transfer gate e.g., along direction across the photodiode region of photodiode 120.

The floating diffusion region 140 may be formed of a doped region having same conductive type as photodiodes 120, e.g., an N-type doped region in the semiconductor material. The floating diffusion region 140 may be formed by ion implantation of N type dopants e.g., phosphorus, arsenic. The floating diffusion region 140 may be connected to multiple transfer gates 130 (in this example embodiment four). The floating diffusion region 140 may collect charges from multiple photodiodes 120 via the transfer gates 130 during a charge transfer operation of device 100.

In operation, image charge is accumulated in respective photodiode region of photodiodes 120 in response to light that is incident upon the photodiodes 120, for example through a backside surface of the semiconductor material. Each of transfer gates 130 operate to transfer the image charges that is accumulated in each respective photodiode 120 to the floating diffusion region 140 in response to transfer signal for subsequent signal read out.

In an alternative embodiment, the isolation layer 110 may be formed of an N-type doped region and the photodiodes 120 and floating diffusion region 140 may be formed of P-type doped region in the semiconductor material that is of N-type.

Figure 2:
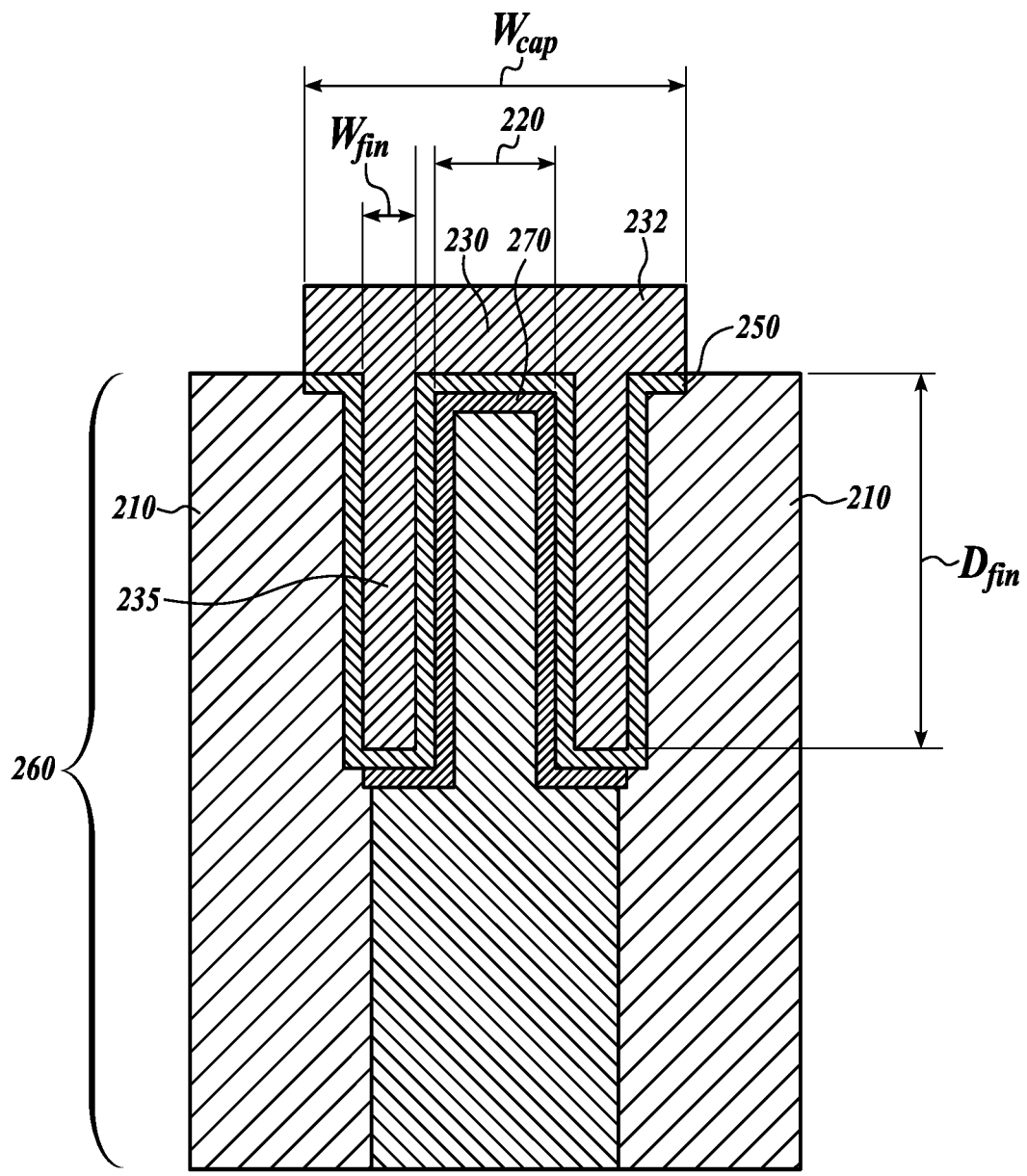
FIG. 2 illustrates an example cross section view of the device in accordance with the teachings of the present invention.

FIG. 2 illustrates an example cross section view of the device 100 in accordance with the teachings of the present invention. FIG. 2 illustrates an example cross-section along the line I-I' in FIG. 1. The cross-sectional view shown in FIG. 2 illustrates a semiconductor material 260 in which the regions can be formed through doping or etching and deposition, including an isolation layer 210, a transfer gate 230, a gate oxide layer 250 and a passivation layer 270. The isolation layer 210 is part of isolation layer 110 and provides electrically and/or optical isolation between photodiodes 120. In embodiments, the transfer gate 230 may be the transfer gate 130, and each of the fin structures 235 is part of fin structures 135.

The transfer gate 230 includes a cap portion 232 (planar gate portion of transfer gate 230) disposed proximate to the semiconductor material 260, and fin structures 235 (vertical gate portion of transfer gate 230) which extend from the cap portion 232 into the semiconductor material 260. In embodiments, the semiconductor material region between fin structures 235 may include a lightly-doped region of same conductive type as photodiode 120 to provide a blooming path for excess charge to flow from photodiode 120 to floating diffusion to prevent respective photodiode 120 from saturation, for example during integration of device 100.

The gate oxide layer 250 is disposed between the transfer gate 230 and the semiconductor material 260. The gate oxide layer 250 may be formed by thermal oxidation or oxide deposition. In one embodiment, the gate oxide layer 250 may be grown on a surface (e.g., front surface) of semiconductor material 260 prior to the formation of transfer gate 230 with appropriate thickness by thermal oxidation process. In one embodiment, the thickness of the gate oxide layer 250 may range between 30 Å-100 Å. Fin structures 235 are formed along a channel width direction of transfer gate 230 (along the length of the cap 232) to increase an effective channel width of transfer gate 230. In one example, two vertical trenches are formed in semiconductor material 260, and the vertical trenches extended from semiconductor material surface (e.g., front surface) of the semiconductor material 260. Gate oxide layer 250 is formed, for example deposited in or grown inside the vertical trenches and conformally to the sidewalls of vertical trenches. Fin structures 235 are disposed into vertical trenches. In embodiments, the fin structures 235 are formed in parallel to each other. The spacing 220 between fin structures 235 may range between 0.05 μm-0.5 μm.

The transfer gate 230 is electrically isolated by the gate oxide layer 250 such that charge accumulated on the transfer gate 230 does not flow to the rest of the device 100 and likewise charge in the rest of the device 100 does not flow to the transfer gate 230. The gate oxide layer 250 is juxtaposed next to the underside of the cap portion 232, and juxtaposed next to the fin structures 235. The gate oxide layer 250 is disposed between fin structures 234 and semiconductor material 260. The gate oxide layer 250 may be formed of an oxide such as silicon dioxide. The passivation layer 270 is disposed juxtaposed next to the gate oxide layer 250 between the fin structures 235 and underneath the fin structures 235 and the cap portion 232. In an example, the passivation layer 270 can be omitted from the fin structures 235 juxtaposed next to the isolation layer 210. The passivation layer 270 is disposed around fin structures 235 of transfer gate 230 and between the fin structures 235 of transfer gate 230 and the semiconductor material 260. In embodiments, each of fin structures 235 is further extended into the photodiode region (e.g., n-type doped region) of the respective photodiode 120 to build up electrical field in the semiconductor material upon receiving the biasing voltage (e.g., transfer signal) facilitating charge transfer between the respective photodiode 120 and floating diffusion region 140 both in surface region and deep in semiconductor material, shorten transfer path and improve image lag. The passivation layer 270 passivates defects formed at interface between fin structures 235 and semiconductor material at the trench sidewalls of fin structures 235 to reduce dark current. The passivation layer 270 is formed of a P-type doped region and may have a similar doping as the isolation layer 210.

It is appreciated that the effective channel width associated with transfer gate 230 is the combination of the width $W_{cap}$ of cap portion 232 and the perimeter of fin structures 335 (e.g., the width of the bottom portion $W_{fin}$ of each fin structure 235 and the side length $D_{fin}$ of each fin structure 235).

In some embodiments, the depth that each of fin structure 235 extended into semiconductor material 260 is substantially the same. In some embodiments, the depth that each of fin structure 235 extended into semiconductor material 260 can be different, for example one fin structure may be extended deeper into semiconductor material 260 than the other. In some embodiments, the width of the fin structure 235 (e.g., the length of the fin structure 235 along the width of cap portion 232) is constant throughout the depth. Restated, the width of the fin structure 235 is the same from the top to bottom of the fin structure 235. When a bias voltage (e.g., a positive voltage) is applied to the transfer gate 230, a channel is formed between the photodiode 120 and floating diffusion region 140. The channel region may be formed in the semiconductor material region proximate to the transfer gate 230, e.g., form underneath the cap portion of transfer gate and along vertical oriented fin structure 235, allowing passage of charge from the photodiode region (or photo-sensing region) of the respective photodiode 120 to the floating diffusion region 140. A majority of the photo-generated charges are transferred through the channel region between the fin structures 235 and underneath the fin structures 235 to the floating diffusion region 140 due to high electrical field generated by the transfer gate 230, however, a portion of the charge will also pass through the isolation layer 210 along the sides of the fin structures 235.

As will be explained in greater detail below, the voltage applied to the transfer gate 230 is controlled by a controller. For example, a transfer signal from the controller may change the voltage applied to the transfer gate 230. The transfer gate 230 is coupled to form a planar channel underneath the cap portion 232 and fin structures 235, and a vertical channel around the fin structures 235 and between fin structures 235 to transfer the charge from the respective photodiode 120 to the floating diffusion region 140 in response to the transfer signal received by the transfer gate 230.

Figure 3:
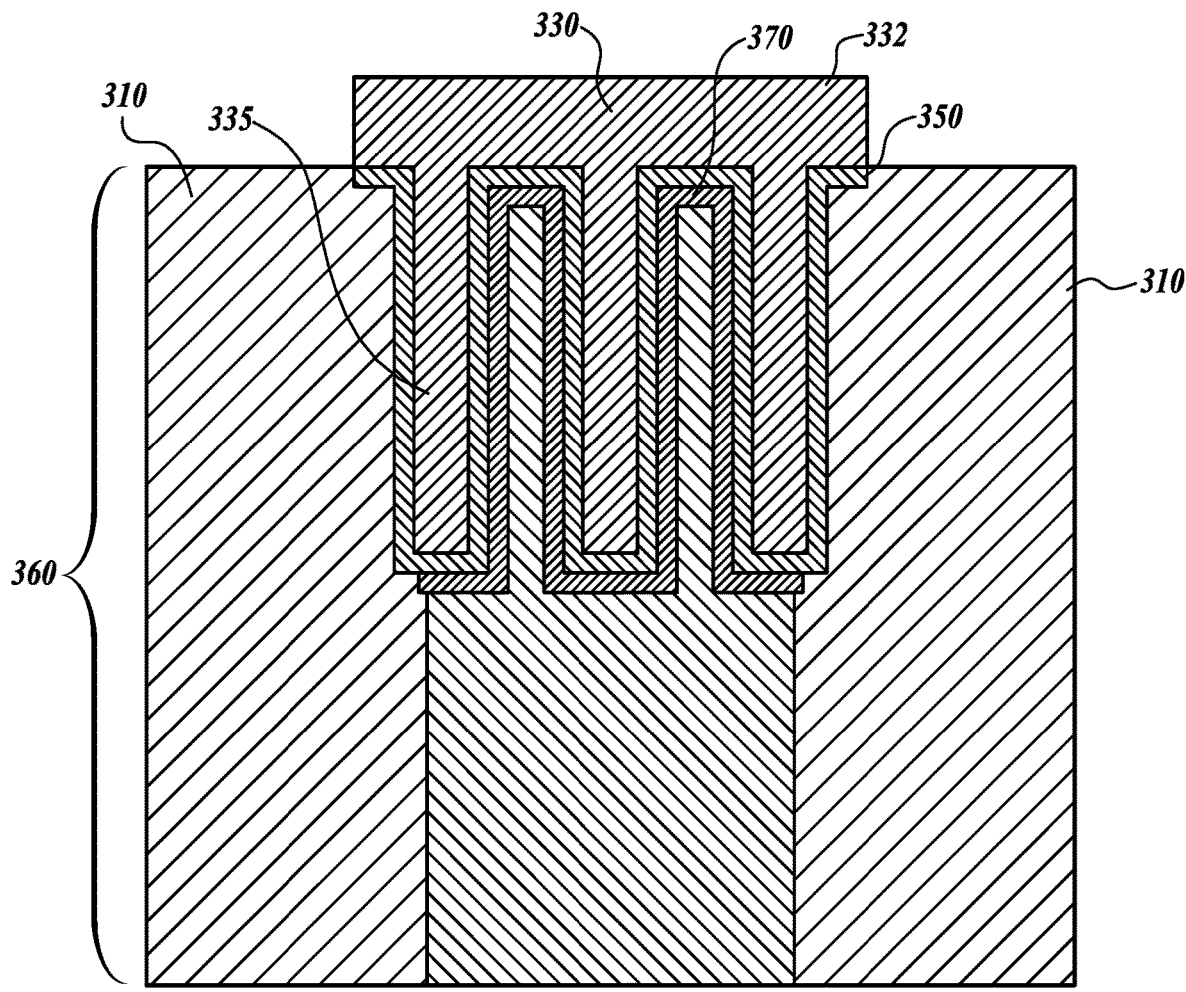
FIG. 3 illustrates another example cross section view of the device in accordance with the teachings of the present invention.

FIG. 3 illustrates an alternative example cross section view of the device 100 in accordance with the teachings of the present invention. FIG. 3 may illustrate an example cross-section along the line I-I' in an embodiment similar to FIG. 1 but with three fin structures to further increase effective channel width. The cross-sectional view shown in FIG. 3 illustrates a semiconductor material 360, an isolation layer 310, a transfer gate 330, a gate oxide layer 350, and a passivation layer 370.

The isolation layer 310 and the passivation layer 370 is formed in the semiconductor material 360. The isolation layer 310 is part of isolation layer 110 and provides electrically and/or optical isolation between photodiodes 120.

The transfer gate 330 includes a cap portion 332 and three fin structures 335 extended from the cap portion 332 into the semiconductor material 360. Each of fin structures 335 is separated from adjacent fin structures 335 by semiconductor material 360. By having the fin structure 335 that extended into the semiconductor material 360, the transfer path between photodiode 120 and floating diffusion region 140 is shortened, and provides better leakage control. In some embodiments, each of fin structures 335 extended into semiconductor material 360 with substantially same depth. In some embodiments, each of fin structures 335 extended into semiconductor material 360 with different depth. For example, the center fin structure may be configured to extend into semiconductor material 360 with shorter depth than the other fin structures. In embodiments, each of fin structures 335 is extended into the photodiode region of respective photodiode 120 to facilitate charge transfer process and improve image lag.

The isolation layer 310, transfer gate 330, gate oxide layer 350, and passivation layer 370 may have the same material properties as the isolation layer 210, transfer gate 230, gate oxide layer 250, and passivation layer 270 and be similarly situated except that the transfer gate 330 includes three fin structures 335 instead of two.

Passivation layer 370, for example, is a P-type doped region formed in the semiconductor material 360 surrounding fin structures 335 for passivating defects on trench sidewalls associated with fin structures 335 caused by trench formation process, such as plasma etching. The inclusion of additional fin structures 335 may decrease resistance and increase transfer current to facilitate charge transfer flow from the photodiode region of photodiode 120 to the floating diffusion region 140 through the channel region, thereby improving image lag issues. The channel region associated with transfer gate 330 includes planar channel region underneath cap portions and vertical channel region around each fin structure 335 and between fin structures 335. However, additional fin structures may take up more space. It is appreciated that any number of fin structures 335 may be used.

Figure 4:
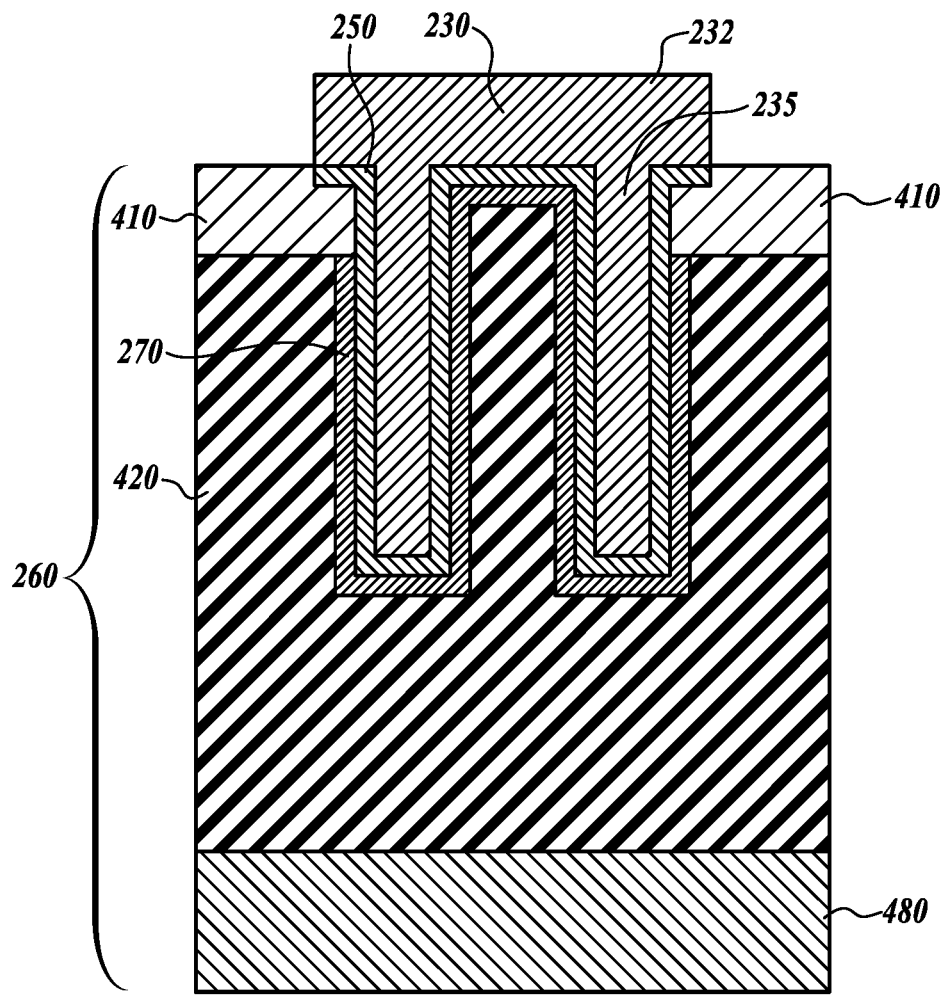
FIG. 4 illustrates yet another example cross section view of the device in accordance with the teachings of the present invention.

FIG. 4 illustrates an example cross section view of the device 100 in accordance with the teachings of the present invention. FIG. 4 illustrates an example cross-section along the line II-II' in FIG. 1. In contrast to FIGS. 2 and 3, FIG. 4 illustrates the fin structures 235 that extend into the photodiode region 420. The cross-sectional view shown in FIG. 4 illustrates a pinning layer 410, the photodiode region 420 of a photodiode 120, a transfer gate 230, a gate oxide layer 250, and a passivation layer 270. In embodiments, the transfer gate 230 may be the transfer gate 130, wherein each of the through semiconductor fin structures 235 being part of through semiconductor fin structures 135 and includes a section extended into the photodiode region 420 of respective photodiode 120.

The photodiode region 420 is formed in the semiconductor material 260, and the pinning layer 410 is disposed in the semiconductor material proximate to a front surface of the semiconductor material 260. The pinning layer 410 is formed between the front surface of the semiconductor material 260 and photodiode region 420. The pinning layer 410 function to provide surface passivation to reduce dark current and white pixel. In embodiments, the pinning layer 410 is electrically connected to isolation layer 110 of FIG. 1. In one embodiment, the pinning layer 410 is grounded.

In one embodiment, there is a semiconductor material region 480 between the photodiode region 420 and a backside surface of the semiconductor material 260. In one embodiment, the semiconductor material region 480 may be part of semiconductor material 260. In one embodiment, the semiconductor material region 480 may be doped semiconductor region, for example doped with dopant having same conductive type as the pinning layer 410. In one embodiment, the semiconductor material region 480 is electrically connected to isolation layer 110 of FIG. 1. In one embodiment, the semiconductor material region 480 is grounded. The transfer gate 230 includes a cap portion 232 and two fin structures 235 extended from the cap portion 232 into the semiconductor material 260 and photodiode region 420, wherein portion of the fin structures 235 extend into the semiconductor material and portion of the fin structures extend into the photodiode region 420. See FIG. 2 for illustration of fin structures 235 that extend in the semiconductor material 260. The transfer gate 230 is electrically isolated by the gate oxide layer 250. As such, the vertical channel region formed by the fin structures 235 upon receiving a biasing voltage extend into the photodiode region 420 of photodiode 120. In other words, a portion of channel region is formed within the photodiode region 420 of photodiode 120 facilitating charge transfer by providing large transfer current and laterally transfer path between the photodiode region 420 of photodiode 120 and floating diffusion region 140 within the semiconductor material. The extension of the fin structures 235 into the photodiode region 420 provides an advantage by shortening charge transfer path and reducing the time to transfer the charge from the photodiode 120 to the floating diffusion region 140.

Accordingly, the great majority of the charge will travel in the channel region formed by the fin structures e.g., channel region proximate to the sides of the fin structures 235 with few charge will travel along the planar region formed underneath the cap portion 432. The fin structures 235 extend into the semiconductor material to a depth less than a depth of the bottom of the photodiode 420. Restated, a junction depth of the photodiode 120 in the semiconductor material 260 is greater than the depth of the plurality of fin structures in the semiconductor material 260. This provides high transfer current and allows the photogenerated charge to enter the channel region from below the fin structures 235 as well as the from between the fin structures 235. This arrangement allows for strong electrical field built between fin structures 235 facilitating charges (for example charge at the sides of the photodiodes 120 and below the fin structures 235) to be transfer to floating diffusion region 140 and reduce delay and resistance to movement of the charge, thereby improve image lag issue.

Figure 5:
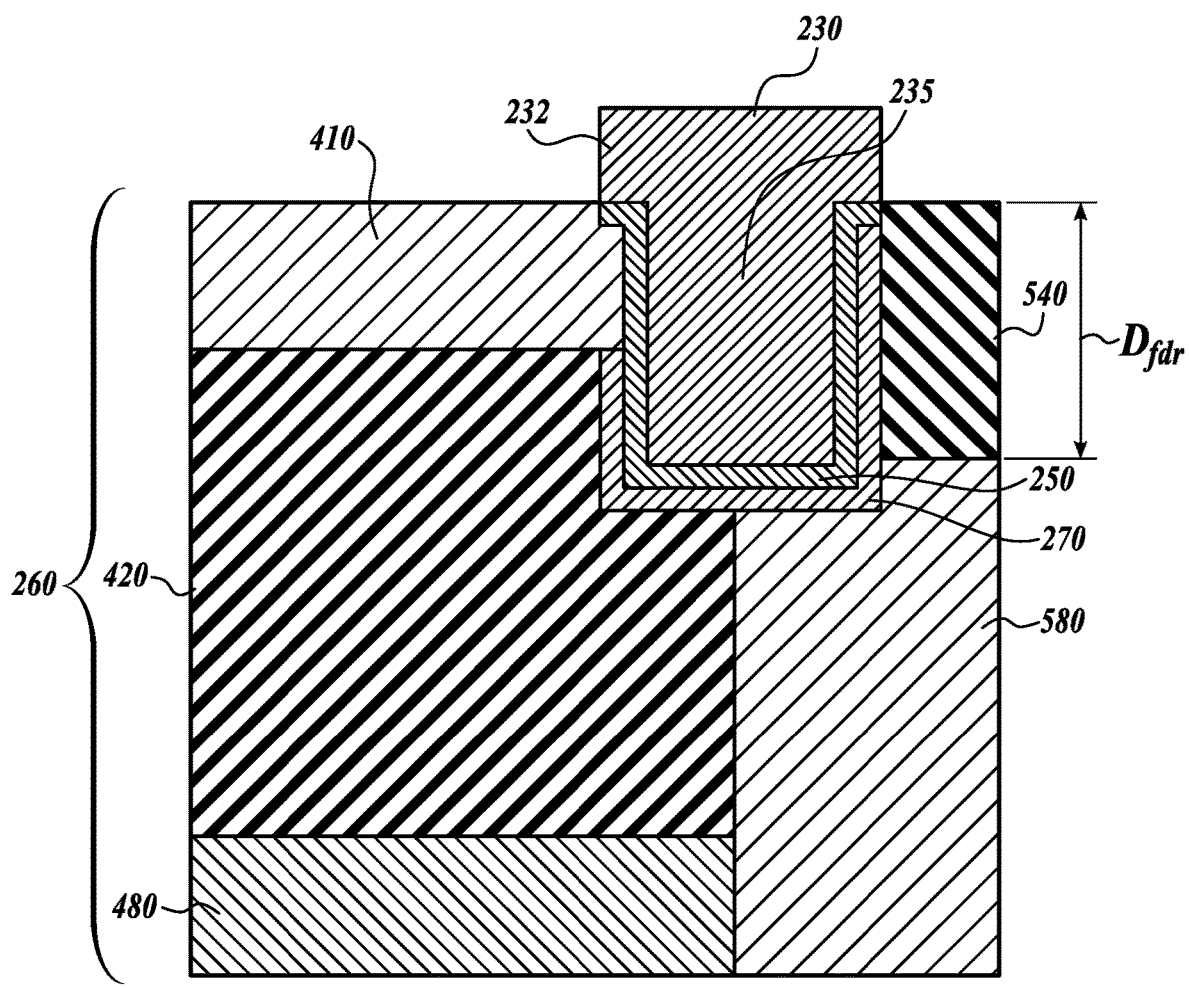
FIG. 5 illustrates still another example cross section view of the device in accordance with the teachings of the present invention.

FIG. 5 illustrates an example cross section view of the device 100 in accordance with the teachings of the present invention. FIG. 5 illustrates an example cross-section along the line in FIG. 1, i.e., along a channel direction of transfer gate 130. The cross-sectional view shown in FIG. 5 illustrates the pinning layer 410, the photodiode region 420 of photodiode 120, semiconductor material 260, transfer gate 230, a floating diffusion region 540, gate oxide layer 250, isolation layer 580, and passivation layer 270. The transfer gate 230 includes a cap portion 232 and fin structure 235 extended from the cap portion 232 into the photodiode region 420 and semiconductor material 260. The pinning layer 410 is disposed in the semiconductor material proximate to a front surface of the semiconductor material. In embodiments, the isolation layer 580 is a P-type doped well region providing isolation between photodiodes 120. In embodiments, the pinning layer 410 is electrically connected to the isolation layer 580. The transfer gate 230 is electrically isolated by the gate oxide layer 250.

Floating diffusion region 540 may be the floating diffusion region 140 or part of the floating diffusion region 140. The floating diffusion region 540 extends to a depth (e.g., junction depth) into the semiconductor material. In some embodiments the floating diffusion region 540 may extend into the semiconductor material a depth less than a depth of the bottom of fin structures 235. Restated, a depth of the plurality of fin structures 235 extended in the semiconductor material is greater than the implanted junction depth of the floating diffusion region 540 in the semiconductor material 260. The junction depth, $D_{fd}$, of the floating diffusion region 540 may range between 0.2 μm~0.4 μm with respect to the front surface of semiconductor material 260. The floating diffusion region 540 may vertically overlapped with photodiode region 420 of photodiode 120.

Charge may be transferred laterally from the photodiode region 420 through the channel region formed along the fin structures 235 and between fin structures to the floating diffusion region 540, when the channel is activated, e.g., transfer gate is turned by a bias voltage. Restated, the charge does not have to travel along the planar channel region formed by cap portion 232 in order to reach the floating diffusion region 540. This lateral path (e.g., substantially horizontal path in FIG. 5) allows for the shortest channel path for the charge in the photodiode region 420 to travel to the floating diffusion region 540. This also allows for efficient use of photodiode 420 throughout the depth of the photodiode region 420 for generating and transferring charge. The transfer gate 230 is coupled to transfer the charge from the photodiode region 420 to the floating diffusion region 540 through the channel region in response to a transfer signal coupled to be received by the transfer gate 230, e.g. when the channel region is activated as the transfer signal increasing the voltage applied to the transfer gate 230.

The fin structure 235 may extend into photodiode region 420 of photodiode 120. The fin structure 235 may contact the floating diffusion region 540. In some embodiments the fin structure 235 may laterally extend into the floating diffusion region 540. This provides an advantage in reducing the resistance and time for the charge to be transferred to the floating diffusion region 540.

Figure 6:
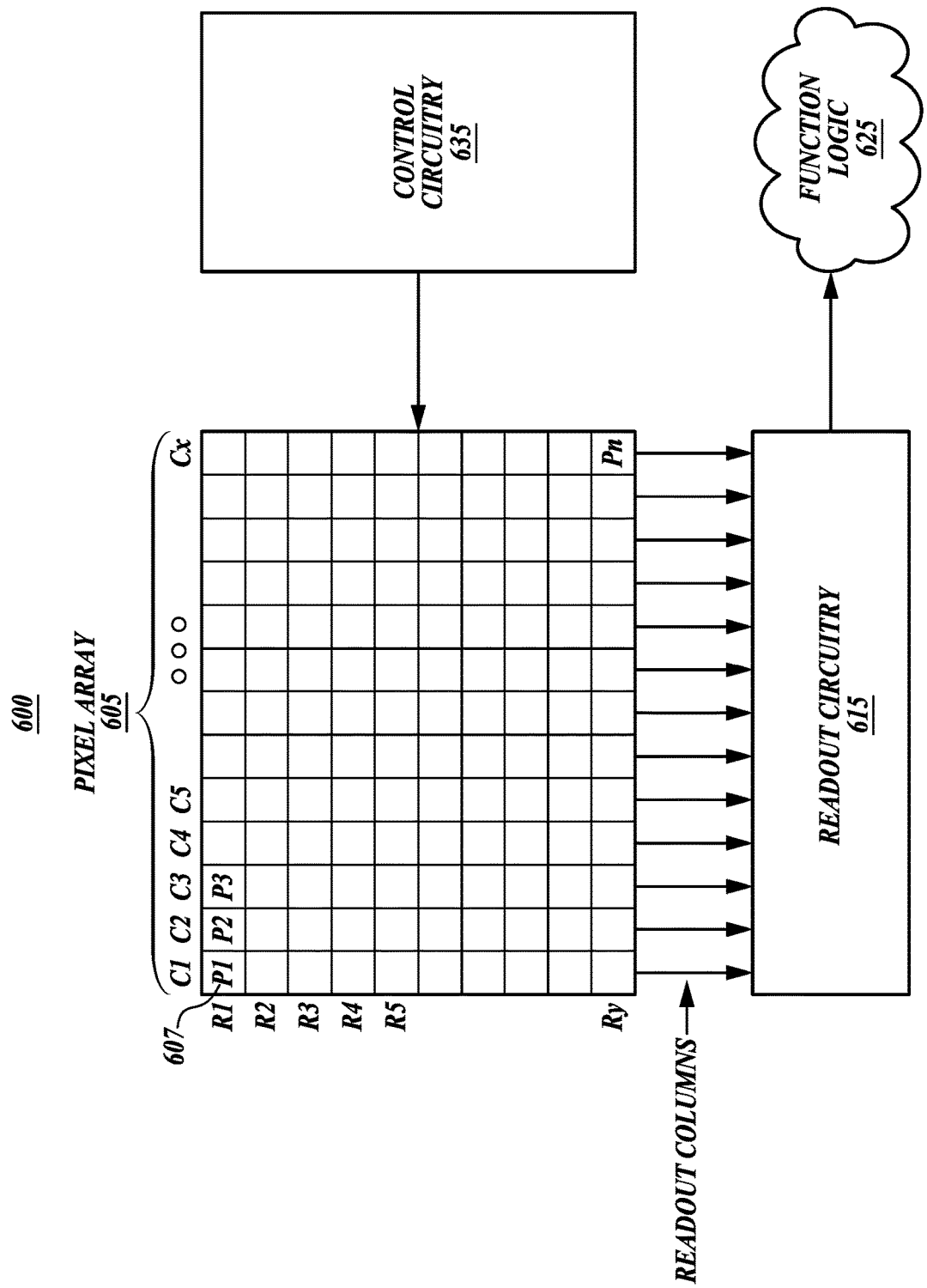
FIG. 6 is a diagram illustrating one example of an imaging system with a pixel array in accordance with the teachings of the present invention.

FIG. 6 is a diagram illustrating one example of an imaging system 600 with a pixel array 605 in accordance with the teachings of the present invention. As shown in the depicted example, an imaging system 600 includes a pixel array 605 coupled to a control circuitry 635 and a readout circuitry 615, which is coupled to a function logic 625.

Pixel array 605 is a two-dimensional ("2D") array of pixels 607 (e.g., pixels P1, P2 . . . , Pn). In one embodiment, each pixel is a complementary metal-oxide-semiconductor ("CMOS") imaging pixel. It is noted that each pixel 607 in the pixel array 605 of FIG. 6 may include one or more photodiodes, transfer gates, and floating drains as discussed in the embodiments above in FIGS. 1-5, and that similarly named and numbered elements referenced below are coupled and function similar to as described above. Pixel array 605 may be implemented as either a front side illuminated image sensor array, or a backside illuminated image sensor array. In one embodiment, pixel array 605 includes a pixel array, such as the pixels depicted in FIG. 1. The pixel array 605 includes a plurality of pixels 607. As illustrated, each pixel 607 is arranged into a row (e.g., rows R1 to Ry) and a column (e.g., column C1 to Cx) to acquire image data of a person, place, or object, which can then be used to render a 2D image of the person, place, or object.

In one embodiment, after each pixel 607 has acquired its image data or image charge, the image data is readout by readout circuitry 615 and transferred to function logic 625. Readout circuitry 615 may include amplification circuitry, e.g., a differential amplifier circuitry, analog-to-digital ("ADC") conversion circuitry, or otherwise.

Function logic 625 may include logic and memory for storing the image data or even manipulating the image data by applying post image effects (e.g., crop, rotate, remove red eye, adjust brightness, adjust contrast, or otherwise). In one example, the readout circuitry 615 may readout a row of image data at a time along readout column lines (illustrated) or may readout the image data using a variety of other techniques (not illustrated), such as a serial readout or a full parallel readout of all pixels simultaneously.

Control circuitry 635 is coupled to pixel array 605. Control circuitry 635 may include logic and memory for controlling operational characteristic of pixel array 605. For example, control circuitry 635 may generate a shutter signal for controlling image acquisition. In one embodiment, the shutter signal is a global shutter signal for simultaneously enabling all pixels 607 within pixel array 605 to simultaneously capture their respective image data during a single acquisition window. In an alternative embodiment, the shutter signal is a rolling shutter signal whereby each row, column, or group of pixels is sequentially enabled during consecutive acquisition windows.

The control circuitry 635 may generate transfer signals and transmit the transfer signals to the transfer gates 130 (FIG. 1) in order to create the channel for the charge to pass from the respective photodiodes 120 to the coupled floating diffusion region 140. The charge received at the floating diffusion region 140 may be read out by the readout circuitry 615. In one example, the charge received at the floating diffusion region 140 may be amplified or buffered by an amplifier or other component which has an output which is read by the readout circuitry 615. Accordingly, the control circuitry 635 and readout circuitry 615 function together as a controller to transmit the transfer signal to the transfer gate and readout the transferred charge.

As can be appreciated by the above description of the image sensor with the transfer gate with a fin structures improves performance of the device in both speed and accuracy of reading out charges generated by the photodiode.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example dimensions, voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A device, comprising:
   a photodiode disposed in a semiconductor material, wherein the photodiode is coupled to generate charges in response to incident light;
   a floating diffusion region disposed in the semiconductor material;

a transfer gate disposed between the photodiode and the floating diffusion region, wherein the transfer gate includes a plurality of fin structures that extend into the semiconductor material and the photodiode; and a channel region associated with the transfer gate, disposed in the semiconductor material proximate to the transfer gate, wherein transfer gate is coupled to transfer the charges from the photodiode to the floating diffusion region through the channel region in response to a transfer signal coupled to be received by the transfer gate.

2. The device of claim 1, wherein the transfer gate includes a cap portion disposed proximate to a front surface of the semiconductor material, wherein the plurality of fin structures extend from the cap portion into the semiconductor material, wherein a portion of the charges is transferred from the photodiode to the floating diffusion region through the channel region along the plurality of fin structures and not along the cap portion when the transfer gate receives a biasing voltage and conducts.

3. The device of claim 2, wherein each of the plurality of fin structures is extended into a photodiode region of the photodiode; wherein a passivation layer is disposed between each fin structure and the photodiode region of the photodiode.

4. The device of claim 2, wherein the portion of the charges transferred from the photodiode to the floating diffusion region through the channel region formed along the plurality of fin structures is a majority of the charge transferred through the channel region between the plurality of fin structures.

5. The device of claim 1 wherein a depth of the plurality of fin structures in the semiconductor material from the front surface of the semiconductor material is greater than a junction depth of the floating diffusion region in the semiconductor material.

6. The device of claim 5, wherein a junction depth of the photodiode in the semiconductor material with respect to the front surface of the semiconductor material is greater than the depth of the plurality of fin structures in the semiconductor material.

7. The device of claim 1, further comprising a gate oxide layer disposed between the transfer gate and the semiconductor material.

8. The device of claim 1, wherein the channel region include a portion formed in a photodiode region of the photodiode.

9. The device of claim 1, wherein the plurality of fin structures is laterally extended into the floating diffusion region.

10. The device of claim 1, further comprising:
a plurality of photodiodes disposed in the semiconductor material, wherein the photodiode is one of the plurality of photodiodes;
a plurality of transfer gates disposed in the semiconductor material, wherein the transfer gate is one of the plurality of transfer gates;
a gate oxide layer disposed between each of the plurality of transfer gates and the semiconductor material; and
a plurality of channel regions in the semiconductor material, wherein channel region is one of the plurality of channel regions, wherein each one of the plurality of transfer gates is coupled to transfer charge from a respective one of the plurality of photodiodes to the floating diffusion region through a respective one of the plurality of channel regions in response to a respective one of a plurality of transfer signals, wherein the transfer signal is one of the plurality of transfer signals.

11. An imaging system, comprising:
a pixel array including a plurality of pixels arranged into a plurality of rows and a plurality of columns, wherein each one of the pixels includes:
a photodiode disposed in a semiconductor material, wherein the photodiode is coupled to generate charges in response to incident light;
a floating diffusion region disposed in the semiconductor material;
a transfer gate disposed between the photodiode and the floating diffusion region, wherein the transfer gate includes a plurality of fin structures that extend into the semiconductor material and the photodiode; and
a channel region in the semiconductor material proximate to the transfer gate, wherein transfer gate is coupled to transfer the charges from the photodiode to the floating diffusion region through the channel region in response to a transfer signal coupled to be received by the transfer gate;
a control circuitry coupled to the pixel array to control operation of the pixel array; and
a readout circuitry coupled to the pixel array to read out image data from the plurality of pixels.

12. The imaging system of claim 11, further comprising function logic coupled to the readout circuitry to store the image data from each one of the plurality of pixels.

13. The imaging system of claim 11, wherein the transfer gate includes a cap portion disposed proximate to a front surface of the semiconductor material, wherein the plurality of fin structures extend from the cap portion into the semiconductor material and the photodiode, wherein a portion of the charges is coupled to be transferred from the photodiode to the floating diffusion region through the channel region along the plurality of fin structures and not along the cap portion.

14. The imaging system of claim 13, wherein at least a portion of the channel region is formed in a photodiode region of the photodiode.

15. The imaging system of claim 13, wherein the portion of the charges transferred from the photodiode to the floating diffusion region through the channel region formed along the plurality of fin structures is a majority of the charge transferred through the channel region between the plurality of fin structures.

16. The imaging system of claim 11 wherein a depth of the plurality of fin structures in the semiconductor material from the front surface of the semiconductor material is greater than a junction depth of the floating diffusion region in the semiconductor material.

17. The imaging system of claim 16, wherein a junction depth of the photodiode in the semiconductor material from the front surface of the semiconductor material is greater than the depth of the plurality of fin structures in the semiconductor material.

18. The imaging system of claim 11, further comprising a gate oxide layer disposed between the transfer gate and the semiconductor material.

19. The imaging system of claim 11, wherein the channel region include a portion formed in photodiode region of the photodiode.

20. The imaging system of claim 11, wherein the plurality of fin structures is laterally extended into the floating diffusion region.

21. The imaging system of claim 11, wherein each one of the plurality of pixels further comprises:

a plurality of photodiodes disposed in the semiconductor material, wherein the photodiode is one of the plurality of photodiodes;

a plurality of transfer gates disposed in the semiconductor material, wherein the transfer gate is one of the plurality of transfer gates;

a plurality of channel regions in the semiconductor material, wherein channel region is one of the plurality of channel regions, wherein each one of the plurality of transfer gates is coupled to transfer charge from a respective one of the plurality of photodiodes to the floating diffusion region through a respective one of the plurality of channel regions in response to a respective one of a plurality of transfer signals, wherein the transfer signal is one of the plurality of transfer signals, wherein the control circuitry is coupled to transmit the plurality of transfer signals.

* * * * *